(12) United States Patent  (10) Patent No.: US 8,704,364 B2
Banijamali  (45) Date of Patent: Apr. 22, 2014

(54) REDUCING STRESS IN MULTI-DIE INTEGRATED CIRCUIT STRUCTURES

(75) Inventor: Bahareh Banijamali, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/369,215

(22) Filed: Feb. 8, 2012

(65) Prior Publication Data

US 2013/0200511 A1  Aug. 8, 2013

(51) Int. Cl.
*H01L 23/34*  (2006.01)
*H01L 29/40*  (2006.01)
*H01L 23/48*  (2006.01)
*H01L 23/52*  (2006.01)

(52) U.S. Cl.
USPC ........... 257/723; 257/621; 257/725; 257/774; 257/778; 257/E23.011; 257/E23.023; 257/E23.079

(58) Field of Classification Search
None
See application file for complete search history.

(56) References Cited

U.S. PATENT DOCUMENTS

| | | | | |
|---|---|---|---|---|
| 4,467,342 A * | 8/1984 | Tower | ............................. | 257/443 |
| 4,803,595 A * | 2/1989 | Kraus et al. | .................... | 361/784 |
| 5,399,898 A * | 3/1995 | Rostoker | ........................ | 257/499 |
| 5,489,804 A * | 2/1996 | Pasch | ............................. | 257/778 |
| 5,715,144 A * | 2/1998 | Ameen et al. | ................. | 361/790 |
| 5,814,847 A * | 9/1998 | Shihadeh et al. | ............. | 257/209 |
| 5,869,894 A * | 2/1999 | Degani et al. | ................. | 257/723 |
| 5,907,903 A * | 6/1999 | Ameen et al. | .................... | 29/830 |
| 6,239,366 B1 * | 5/2001 | Hsuan et al. | ................... | 174/529 |
| 6,369,444 B1 * | 4/2002 | Degani et al. | ................. | 257/724 |
| 6,407,456 B1 * | 6/2002 | Ball | .............................. | 257/777 |
| 6,410,983 B1 * | 6/2002 | Moriizumi et al. | ........... | 257/723 |
| 6,429,509 B1 * | 8/2002 | Hsuan | ........................... | 257/690 |
| 6,500,696 B2 * | 12/2002 | Sutherland | .................... | 438/109 |
| 6,559,531 B1 * | 5/2003 | Sutherland | .................... | 257/686 |
| 6,611,635 B1 | 8/2003 | Yoshimura et al. | | |
| 6,731,009 B1 * | 5/2004 | Jones et al. | .................... | 257/777 |
| 6,734,553 B2 * | 5/2004 | Kimura | ......................... | 257/723 |
| 6,870,271 B2 * | 3/2005 | Sutherland et al. | ........... | 257/777 |
| 6,930,378 B1 * | 8/2005 | St. Amand et al. | ........... | 257/686 |
| 6,972,487 B2 * | 12/2005 | Kato et al. | ..................... | 257/723 |
| 6,984,889 B2 * | 1/2006 | Kimura | ......................... | 257/723 |
| 6,992,395 B2 * | 1/2006 | Fukasawa | ...................... | 257/777 |
| 7,030,466 B1 * | 4/2006 | Hsuan | ........................... | 257/621 |
| 7,071,568 B1 * | 7/2006 | St. Amand et al. | ........... | 257/777 |
| 7,087,989 B2 * | 8/2006 | Nakayama | ..................... | 257/686 |
| 7,098,542 B1 * | 8/2006 | Hoang et al. | .................. | 257/778 |
| 7,132,753 B1 * | 11/2006 | St. Amand et al. | ........... | 257/777 |
| 7,215,016 B2 * | 5/2007 | Wang | ............................. | 257/686 |
| 7,230,329 B2 * | 6/2007 | Sawamoto et al. | ............ | 257/686 |
| 7,402,901 B2 * | 7/2008 | Hatano et al. | ................. | 257/684 |
| 7,425,760 B1 * | 9/2008 | Guenin et al. | ................. | 257/698 |
| 7,436,061 B2 * | 10/2008 | Nakayama | ..................... | 257/730 |

(Continued)

OTHER PUBLICATIONS

U.S. Appl. No. 13/535,102, filed Jun. 27, 2012, Camarota, Rafael C., Xilinx, Inc., 2100 Logic Drive, San Jose, CA US.

(Continued)

*Primary Examiner* — Hoang-Quan Ho
(74) *Attorney, Agent, or Firm* — Kevin T. Cuenot

(57) ABSTRACT

An integrated circuit structure can include a first interposer and a second interposer. The first interposer and the second interposer can be coplanar. The integrated circuit structure further can include at least a first die that is coupled to the first interposer and the second interposer.

10 Claims, 3 Drawing Sheets

(56) References Cited

U.S. PATENT DOCUMENTS

| | | | |
|---|---|---|---|
| 7,459,776 B1 * | 12/2008 | St. Amand et al. | 257/686 |
| 7,859,119 B1 * | 12/2010 | St. Amand et al. | 257/777 |
| 7,906,852 B2 * | 3/2011 | Nishimura et al. | 257/777 |
| 7,999,383 B2 * | 8/2011 | Hollis | 257/758 |
| 8,062,968 B1 * | 11/2011 | Conn | 438/612 |
| 8,072,057 B2 * | 12/2011 | Matsumura | 257/686 |
| 8,080,874 B1 * | 12/2011 | Werner et al. | 257/723 |
| 8,097,957 B2 * | 1/2012 | Chen et al. | 257/777 |
| 8,163,600 B2 * | 4/2012 | Chow et al. | 438/109 |
| 8,227,904 B2 * | 7/2012 | Braunisch et al. | 257/686 |
| 8,237,289 B2 * | 8/2012 | Urakawa | 257/777 |
| 8,274,794 B2 * | 9/2012 | Huang et al. | 361/735 |
| 8,295,056 B2 | 10/2012 | Andry et al. | |
| 8,338,963 B2 * | 12/2012 | Haba et al. | 257/777 |
| 8,344,519 B2 * | 1/2013 | Lu et al. | 257/777 |
| 8,415,783 B1 | 4/2013 | Rahman et al. | |
| 2002/0024146 A1 * | 2/2002 | Furusawa | 257/777 |
| 2002/0175421 A1 | 11/2002 | Kimura | |
| 2003/0183917 A1 * | 10/2003 | Tsai et al. | 257/686 |
| 2004/0184250 A1 * | 9/2004 | Wang | 361/790 |
| 2004/0195668 A1 * | 10/2004 | Sawamoto | 257/686 |
| 2004/0195682 A1 * | 10/2004 | Kimura | 257/723 |
| 2004/0227223 A1 * | 11/2004 | Sawamoto | 257/686 |
| 2006/0001163 A1 * | 1/2006 | Kolbehdari et al. | 257/758 |
| 2006/0017147 A1 * | 1/2006 | Drost et al. | 257/686 |
| 2006/0099736 A1 * | 5/2006 | Nagar et al. | 438/108 |
| 2006/0157866 A1 * | 7/2006 | Le et al. | 257/777 |
| 2006/0220227 A1 * | 10/2006 | Marro | 257/723 |
| 2006/0226527 A1 * | 10/2006 | Hatano et al. | 257/686 |
| 2006/0226529 A1 * | 10/2006 | Kato et al. | 257/686 |
| 2007/0023921 A1 * | 2/2007 | Zingher et al. | 257/778 |
| 2007/0029646 A1 * | 2/2007 | Voldman | 257/662 |
| 2007/0210428 A1 * | 9/2007 | Tan et al. | 257/678 |
| 2007/0231966 A1 | 10/2007 | Egawa | |
| 2007/0278642 A1 * | 12/2007 | Yamaguchi et al. | 257/686 |
| 2008/0179735 A1 * | 7/2008 | Urakawa | 257/691 |
| 2009/0057919 A1 * | 3/2009 | Lin et al. | 257/777 |
| 2009/0267238 A1 * | 10/2009 | Joseph et al. | 257/777 |
| 2010/0330741 A1 * | 12/2010 | Huang et al. | 438/107 |
| 2011/0019368 A1 | 1/2011 | Andry et al. | |
| 2011/0169171 A1 * | 7/2011 | Marcoux | 257/774 |
| 2011/0180317 A1 | 7/2011 | Takahashi et al. | |
| 2011/0254162 A1 * | 10/2011 | Hollis | 257/738 |
| 2011/0316572 A1 * | 12/2011 | Rahman | 324/754.03 |
| 2012/0019292 A1 * | 1/2012 | Lu et al. | 327/143 |
| 2012/0020027 A1 | 1/2012 | Dungan et al. | |
| 2012/0032342 A1 * | 2/2012 | Min et al. | 257/774 |
| 2012/0124257 A1 | 5/2012 | Wu | |
| 2012/0206889 A1 | 8/2012 | Norman | |
| 2012/0301977 A1 | 11/2012 | Andry et al. | |
| 2012/0319248 A1 * | 12/2012 | Rahman | 257/621 |
| 2013/0020675 A1 * | 1/2013 | Kireev et al. | 257/531 |
| 2013/0134553 A1 | 5/2013 | Kuo et al. | |

OTHER PUBLICATIONS

U.S. Appl. No. 13/399,939, filed Feb. 17, 2012, WU, Ephrem C., Xilinx, Inc., 2100 Logic Drive, San Jose, CA US.

U.S. Appl. No. 13/527,453, filed Jun. 19, 2012, Hisamura, Toshiyuki, Xilinx, Inc., 2100 Logic Drive, San Jose, CA US.

* cited by examiner

REDUCING STRESS IN MULTI-DIE INTEGRATED CIRCUIT STRUCTURES

FIELD OF THE INVENTION

One or more embodiments disclosed within this specification relate to integrated circuits (ICs). More particularly, one or more embodiments relate to reducing stress in multi-die IC structures.

BACKGROUND

Multi-die integrated circuits (ICs) are a class of ICs in which multiple dies are placed within a single package. A multi-die IC also can be referred to as a "system in a package" or "SiP." A multi-die IC can include circuit structures that allow the dies to communicate with one another within the single package at faster speeds than would be attainable were the dies to be implemented as separately packaged ICs mounted on a printed circuit board.

In order to function with this increased level of speed and/or efficiency, signals must be able to propagate from one die to another within a multi-die IC. The circuit structures that effectuate the inter-die exchange of signals must be fabricated with at least a minimum level of reliability. Otherwise, yields can decrease thereby increasing the cost of producing multi-die ICs. Avoiding defects within multi-die IC structures is particularly important since a single defect can render multiple dies useless.

For example, one of the structures that can be used to facilitate the transfer of inter-die signals is a die on which one or more other dies can be mounted. The die, sometimes referred to as an "interposer," can include metal interconnects that propagate signals among the dies mounted on the interposer. Reducing the likelihood of defects within the interposer and connections between the interposer and other IC structures can increase yield significantly.

SUMMARY

One or more embodiments disclosed within this specification relate to integrated circuits, and more particularly, to reducing stress in multi-die integrated circuit structures.

An embodiment can include an integrated circuit structure. The integrated circuit structure can include a first interposer and a second interposer. The first interposer and the second interposer can be coplanar. The integrated circuit structure also can include a first die coupled to the first interposer and the second interposer.

Another embodiment can include an integrated circuit structure. The integrated circuit structure can include a substrate that includes a surface and a first interposer having a first surface and a second surface. The first surface of the first interposer can be coupled to the surface of the substrate. The integrated circuit structure also can include a second interposer having a first surface and a second surface where the first surface of the second interposer is coupled to the surface of the substrate. The integrated circuit structure can include a first die coupled to the second surface of the first interposer and the second surface of the second interposer.

Another embodiment can include an integrated circuit structure. The integrated circuit structure can include a substrate including a surface. The integrated circuit structure can include a first interposer having a first surface and a second surface, wherein the first surface of the first interposer is coupled to the surface of the substrate, and a second interposer having a first surface and a second surface, wherein the first surface of the second interposer is coupled to the surface of the substrate. The integrated circuit structure also can include a third interposer having a first surface and a second surface, wherein the first surface of the third interposer is coupled to the surface of the substrate. The integrated circuit structure further can include a first die coupled to the second surface of the first interposer and the second surface of the second interposer and a second die coupled to the second surface of the second interposer and the second surface of the third interposer.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs), and more particularly, to reducing stress in multi-die IC structures. A die upon which one or more other dies can be mounted can be referred to as an "interposer." In general, the interposer serves as the mechanism by which two or more other dies of the multi-die IC structure communicate. The interposer typically is large enough to accommodate two or more dies of the multi-die IC structure being mounted on a same surface of the interposer.

The larger size of the interposer induces large amounts of stress on the interposer and on other IC structures that couple to the interposer. For example, solder bumps below the interposer that couple the interposer to the substrate of an IC package can be exposed to a significant amount of stress that is dependent upon the size of the interposer. Accordingly, the interposer can be split or subdivided into two or more individual interposers rather than using a single, monolithic interposer. In consequence, the smaller interposers and any IC structure coupled to the smaller interposers are subjected to reduced stress, thereby increasing reliability of the multi-die IC structure.

Figure 1:
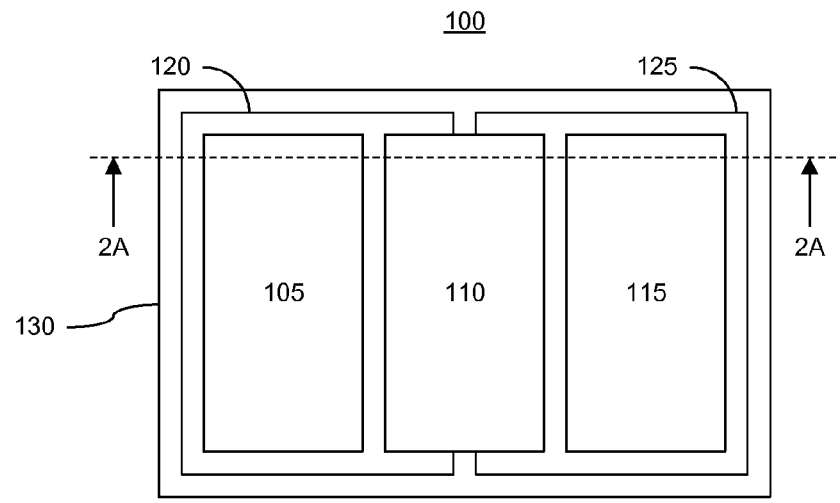
FIG. 1 is a block diagram illustrating a topographic view of an integrated circuit (IC) structure in accordance with an embodiment disclosed within this specification.

FIG. 1 is a block diagram illustrating a topographic view of an IC structure 100 in accordance with an embodiment disclosed within this specification. IC structure 100 is a multi-die IC structure. FIG. 1 illustrates a packing approach to stacking multiple dies of IC structure 100 within a single package. As pictured in FIG. 1, IC structure 100 can include a plurality of dies 105, 110, and 115. Dies 105-115 can be mounted on two or more interposers 120 and 125. Interposers 120 and 125 each can be implemented as a silicon interposer. Interposers 120 and 125 can be mounted on a substrate 130 of an IC package within which IC structure 100 can be implemented.

Each of interposers 120 and 125 can be a die having a planar surface on which dies 105, 110, and 115 can be horizontally stacked. As shown, dies 105 and 110 can be located on the planar surfaces of interposers 120 and 125 side-by-side. In the example shown in FIG. 1, die 105 is mounted only to interposer 120. Die 115 is mounted only to interposer 125. Die 110 is mounted to both interposer 120 and to interposer 125. In general, each of dies 105, 110, and 115 can be coplanar. Similarly, each of interposers 120 and 125 can be coplanar. As used within this specification, the term "coplanar" can mean that the enumerated structures are located in a same plane or that each enumerated structure has at least one surface that is in a same plane as the others.

Each of interposers 120 and 125 can provide a common mounting surface and electrical coupling point for one or more dies of a multi-die IC structure. Interposers 120 and 125 can serve as an intermediate layer for interconnect routing between dies 105, 110, and 115 or as a ground or power plane for IC structure 100. Each of interposers 120 and 125 can be implemented with a silicon wafer substrate, whether doped or un-doped with an N-type and/or a P-type impurity. The manufacturing of interposers 120 and 125 can include one or more additional process steps that allow the deposition of one or more layer(s) of metal interconnect. These metal interconnect layers can include aluminum, gold, copper, nickel, various silicides, and/or the like.

Interposers 120 and 125 can be manufactured using one or more additional process steps that allow the deposition of one or more dielectric or insulating layer(s) such as, for example, silicon dioxide. In general, interposer 120 and/or 125 can be implemented as passive dies in that one or both of interposers 120 and/or 125 can include no active circuit elements, e.g., no P-material in contact with N-material or "PN" junctions. In another aspect, interposers 120 and 125 can be manufactured using one or more additional process steps that allow the creation of active circuit elements such as, for example, transistor devices and/or diode devices. As noted, each of interposers 120 and 125 is, in general, a die and is characterized by the presence of one or more TSVs as will be described in greater detail within this specification.

Figure 2A:
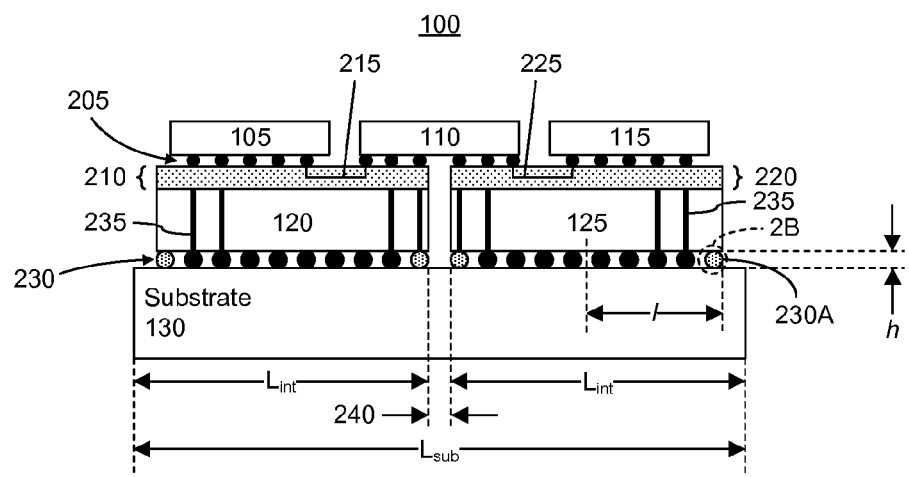
FIG. 2A is a block diagram illustrating a cross-sectional side view of the IC structure of FIG. 1.

FIG. 2A is a block diagram illustrating a cross-sectional side view of IC structure 100 of FIG. 1. More particularly, FIG. 2A illustrates a view of IC structure 100 of FIG. 1 taken along cut-line 2A-2A. As such, like numbers will be used to refer to the same items throughout this specification.

As shown, a first (bottom) surface of interposer 120 can be coupled to a top surface of substrate 130. Similarly, a first (bottom) surface of interposer 125 can be coupled to the top surface of substrate 130. A second (top) surface of interposer 120 can be coupled to a bottom surface of die 105 and to a portion of a bottom surface of die 110. A second (top) surface of interposer 125 can be coupled to a portion of the bottom surface of die 110 and to a bottom surface of die 115.

In one aspect, dies 105, 110, and 115 can be electrically coupled to interposers 120 and 125 via solder bumps 205. In an embodiment, solder bumps 205 can be implemented in the form of "micro-bumps." More particularly, die 105 is coupled to interposer 120 through solder bumps 205. Die 110 is coupled to interposer 120 and to interposer 125 through solder bumps 205. Die 115 is coupled to interposer 125 through solder bumps 205. Each of solder bumps 205 also can serve to physically attach dies 105, 110, and 115 to interposer 120 and/or to interposer 125 as the case may be.

Interposer 120 can include one or more patterned layers formed of metal or another conductive material forming interconnect region 210. The patterned layers can be used to form inter-die wires such as inter-die wire 215 that can pass inter-die signals between dies 105 and 110. For example, inter-die wire 215 can be formed using one or more of the patterned metal layers in combination with one or more vias from interconnect region 210. Inter-die wire 215 can connect to one of solder bumps 205 located between die 105 and interposer 120 and to another one of solder bumps 205 located between die 110 and interposer 120, thereby coupling die 105 to die 110 and allowing the exchange of signals between dies 105 and 110.

Interposer 125 can include one or more patterned layers formed of metal or another conductive material forming interconnect region 220. Interconnect region 220 can be substantially similar to interconnect region 210 of interposer 120. Accordingly, the patterned layers and vias can be used to form inter-die wires such as inter-die wire 225. Inter-die wire 225 can connect to one of solder bumps 205 located between die 110 and interposer 125 and to another one of solder bumps 205 located between die 115 and interposer 125, thereby coupling die 110 to die 115 and allowing the exchange of signals between dies 110 and 115.

Although the coupling of dies 105, 110, and 115 to interposers 120 and 125 is accomplished using solder bumps 205, a variety of other techniques can be used to couple dies 105, 110, and 115 to interposers 120 and 125. For example, bond wires or edge wires can be used to couple a die to one or more interposers. In another example, an adhesive material can be used to physically attach a die to one or more interposers. As such, the coupling of dies 105, 110, and 115 to interposers 120 and 125 via solder bumps 205, as illustrated within FIG. 2A, is provided for purposes of illustration and is not intended to limit the one or more embodiments disclosed within this specification.

Solder bumps 230 can be used to electrically couple the bottom surface of each of interposers 120 and 125 to substrate 130. In an aspect, solder bumps 230 can be implemented in the form of "C4-bumps." As noted, substrate 130 can be part of a multi-die IC package in which IC structure 100 is implemented. Solder bumps 230 can be used to couple IC structure 100 to a node external to the multi-die IC package.

Each of interposers 120 and 125 can include one or more through-silicon vias (TSVs) 235. In general, each TSV 235 can be implemented as a via formed of conductive material to form an electrical connection that vertically transverses, e.g., extends through a substantial portion, if not the entirety of, interposer 120 and/or interposer 125. For example, TSVs 235 can be implemented by drilling or etching an opening into interposer 120 and/or interposer 125 that extends from a top planar surface, i.e., the surface to which solder bumps 205 are coupled, through to a bottom planar surface, i.e., the surface to which solder bumps 230 are coupled. Conductive material then can be deposited within the openings. Examples of conductive material that can be used to fill the openings to form TSVs 235 can include, but are not limited to, aluminum, gold, copper, nickel, various silicides, and/or the like.

In the example shown in FIG. 2A, each TSV 235 is shown to couple to solder bumps 205 through one or more of the patterned layers in combination with one or more vias within interconnect region 210 in interposer 120 or within interconnect region 220 in interposer 125. In another example, however, TSVs 235 can extend substantially through interposer 120 and interposer 125 to couple solder bumps 205 with solder bumps 230 by passing through interconnect region 210 or interconnect region 220 as the case may be.

TSVs 235, in combination with solder bumps 205 and solder bumps 230, couple die 105 to substrate 130 via interposer 120. Die 110 is coupled to substrate 130 using TSVs 235, solder bumps 205, and solder bumps 230 through interposer 120 and through interposer 125. Die 115 is coupled to substrate 130 using TSVs 235, solder bumps 205, and solder bumps 230, through interposer 125.

In one aspect, signals can be propagated from die 105 to die 115 through inter-die wires such as inter-die wire 215 and inter-die wire 225 in combination with wires or other signal paths implemented within die 110 that couple inter-die wire 215 with inter-die wire 225. The signal paths implemented within die 110 can be implemented in the form of hardwired circuitry or programmable circuitry.

For example, dies 105, 110, and 115 can be implemented as any of a variety of different types of dies. One or more of dies 105, 110, and 115 can be implemented as a memory device, a processor, e.g., a central processing unit, an application-specific IC, or a programmable IC. Each such type of IC can include hardwired circuitry coupling inter-die wire 215 with inter-die wire 225. Each of dies 105, 110, and 115 can be implemented as a similar or same type of IC. In the alternative, die 105 can be implemented as first type of IC, while dies 110 and 115 are implemented as a second and different type of IC. In still another example, each of dies 105, 110, and 115 can be implemented as a different type of IC.

In general, a programmable IC refers to a type of IC that can be programmed to perform specified functions. One example of an IC that can be programmed is a field programmable gate array (FPGA). An FPGA typically includes an array of programmable tiles. These programmable tiles can include, for example, input/output blocks, configurable logic blocks, dedicated random access memory blocks, multipliers, digital signal processing blocks, processors, clock managers, delay lock loops, and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to I/O resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC.

In general, the functionality of programmable circuitry is not established until configuration data is loaded into the IC. A set or sets of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function as manufactured as part of the IC.

In any case, the signal paths in die 110 that couple inter-die wire 215 to inter-die wire 225 can be hardwired or programmable circuitry. In the case of programmable circuitry, die 105 can be rendered unable to communicate with die 115 unless or until programmable circuitry is configured to implement such a connection.

Within IC structure 100, interposer 120 and interposer 125 can be separated by a distance 240. The respective edge of each of interposers 120 and 125 effectively forms a channel having a width equal to distance 240 that extends between each of interposers 120 and 125. As shown, die 110 effectively spans the channel between interposer 120 and interposer 125. Each of interposers 120 and 125 can have a length of $L_{int}$. Substrate 130 can have a length of $L_{sub}$. Though illustrated as having a same length, each of interposers 120 and 125 can have different lengths depending upon the implementation of IC structure 100.

IC structure 100 is subjected to a variety of different stresses. For example, interposers 120 and 125 are subjected to stress as each provides a structural base upon which dies are mounted. Further solder bumps and, in particular, solder bumps 230, can be subjected to increased levels of stress. In one aspect, solder bumps 230 that are located along one or more or all edges edge of interposer 120 and/or 125 can be subjected to increased levels of shear strain.

Referring to FIG. 2A, the particular ones of solder bumps 230 that are subjected to increased levels of shear strain are illustrated with shading as opposed to the solid coloration of the other ones of solder bumps 230. The left-most and right-most solder bumps 230 beneath interposer 120 are subjected to a higher level of shear strain than other ones of the solder bumps 230 between interposer 120 and substrate 130. Similarly, the left-most and right-most of solder bumps 230 beneath interposer 125 are subjected to a higher level of shear strain than other ones of solder bumps 230 between interposer 125 and substrate 130.

In general, shear strain (γ) can be determined according to equation (1) below.

$$\gamma = \frac{\in_{thermal} l \Delta \theta}{h} \quad (1)$$

Figure 2B:
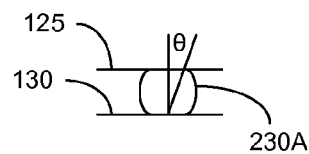
FIG. 2B is a block diagram illustrating a blow-up of a portion of the IC structure shown in FIG. 2A.

Within equation (1), $\in_{thermal}$ represents the thermal expansion coefficient, l represents length, Δθ represents the difference in the angle θ before application of shear strain and after application of shear strain as shown in FIG. 2B, and h represents height. Referring to FIG. 2B, for example, the angle θ is initially zero when solder bump 230A is not exposed to shear strain. After solder bump 230A is located between interposer 125 and substrate 130, thereby exposing solder bump 230A to shear strain, solder bump 230A flattens. In one example, as shown in FIG. 2B, the vertex of θ is the center of the bottom flattened portion of solder bump 230A. The angle θ is measured as shown from the center line aligned with the vertex to the end point of the top flattened portion of solder bump 230A in contact with interposer 125, e.g., approximately one half of the top flattened portion of solder bump 230A in contact with interposer 125.

Equation (1) can be applied to FIG. 2A to determine the shear strain to which solder bump 230A, for example, is subjected. In that case, the variable l represents a length measured from a center of an interposer, i.e., interposer 125 in this case, to an outer edge solder bump 230A. In this example, l is one-half of $L_{int}$. The variable h represents the height of solder bump 230A. The coefficient of thermal expansion is, in effect, the difference between the coefficient of thermal expansion for substrate 130 and the coefficient of thermal expansion for interposer 125. For purposes of discussion, it can be assumed that the coefficient of thermal expansion for interposer 125 is approximately 3 and the coefficient of thermal expansion for substrate 130 is approximately 12. Accordingly, equation (1) can be reduced to equation (2) below.

$$\gamma = \frac{9l \Delta \theta}{h} \quad (2)$$

As shown, the shear strain is generally dependent upon the length of each interposer, e.g., $L_{int}$. The shear strain to which solder bump 230A is subjected can be reduced by reducing $L_{int}$, which also reduces l. Accordingly, rather than using a single, monolithic interposer, shear strain on solder bump 230A and on other bumps similarly positioned, can be reduced by using two or more smaller interposers, e.g., interposers that have reduced length compared to a single, monolithic interposer.

Figure 3:
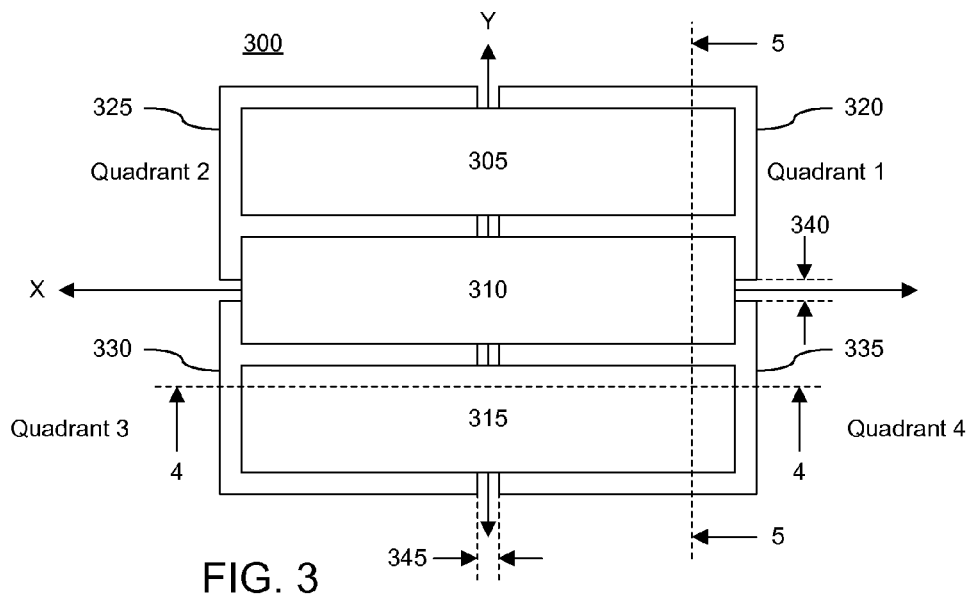
FIG. 3 is a block diagram illustrating a topographic view of an IC structure in accordance with another embodiment disclosed within this specification.

FIG. 3 is a block diagram illustrating a topographic view of an IC structure 300 in accordance with another embodiment disclosed within this specification. IC structure 300 is a multi-die IC structure. As pictured, IC structure 300 can include a plurality of dies 305, 310, and 315. Dies 305, 310, and 315 can be coplanar and, as such can be mounted on interposers 320, 325, 330, and 335. Each of interposers 320, 325, 330, and 335 can be implemented as a silicon interposer substantially as described with reference to FIGS. 1 and 2. Interposers 320, 325, 330, and 335 can be coplanar and mounted on a substrate of an IC package within which IC structure 300 can be implemented. For ease of illustration, the substrate is not shown in FIG. 3.

IC structure 300 is shown superimposed over a Cartesian coordinate system in which the X-axis bisects IC 300 into two equal halves and the Y-axis bisects IC structure 300 into two equal halves. The X-axis is perpendicular to the Y-axis. As illustrated, interposer 320 is located entirely within quadrant 1. Interposer 325 is located entirely within quadrant 2. Interposer 330 is located entirely within quadrant 3. Interposer 335 is located entirely within quadrant 4.

For purposes of reference, the bottom surface of each interposer 320, 325, 330, and 335 can be referred to as the first surface. The top surface of each interposer 320, 325, 330, and 335 to which the dies are mounted can be referred to as the second surface. As shown, die 305 is mounted on a portion of the second surface of interposer 320 and a portion of the second surface of interposer 325. Die 305 is located within only quadrants 1 and 2. Die 310 is mounted on a portion of the second surface of each of interposers 320, 325, 330, and 335 and is partly within each of quadrants 1-4. Die 315 is mounted on a portion of the second surface of interposer 330 and a portion of the second surface of interposer 335. Thus, die 315 is located only within quadrants 3 and 4.

Each of interposers 320 and 325 can include one or more inter-die wires that can be used to couple die 305 with die 310. Similarly, each of interposers 330 and 335 can include one or more inter-die wires that can be used to couple dies 310-315. Die 310 can be configured with wires or signal paths that can couple interposer 320 to one, or more or each of interposers 325, 330, and 335. Similarly, die 310 can be configured with wires or signals that can couple interposer 325 with one, or more or each of interposers 320, 330, and 335. Die 305 can be configured with wires or signal paths that can couple interposer 320 to interposer 325. Similarly, die 315 can be configured with wires or signal paths that can couple interposer 330 with interposer 335.

As discussed with reference to FIG. 2, each of interposers 320, 325, 330, and 335 can include one or more TSVs. Accordingly, die 305 can be coupled to the substrate through one or more TSVs located within interposer 320 and/or one or more TSVs located within interposer 325. Die 310 can be coupled to the substrate through one or more TSVs located within interposer 320, interposer 325, interposer 330, and/or interposer 335. Die 315 can be coupled to the substrate through one or more TSVs located within interposer 330 and/or one or more TSVs located within interposer 335.

In general, interposer 320 can be separated from interposer 335 by a predetermined distance 340. Similarly, interposer 325 can be separated from interposer 330 by the predetermined distance 340. Accordingly, the separation described effectively forms a channel along the X-axis having a width of the distance 340. Die 310 effectively spans distance 340 of the channel formed on the X-axis shown.

Interposer 320 can be separated from interposer 325 by a predetermined distance 345. Similarly, interposer 330 can be separated from interposer 335 by the predetermined distance 345. Accordingly, the separation described effectively forms a channel along the Y-axis having a width of the distance 345. Each of dies 305, 310, and 315 effectively spans distance 345 of the channel formed on the Y-axis shown.

Figure 4:
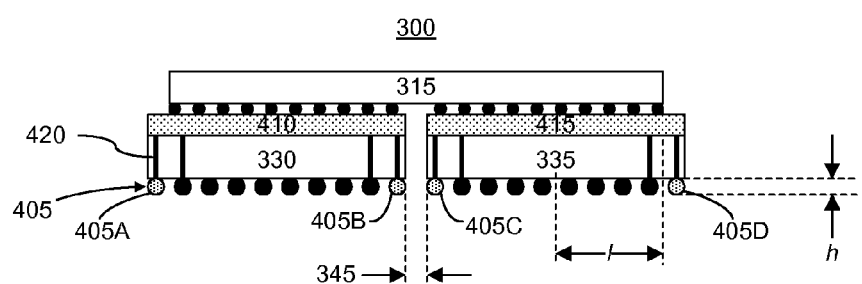
FIG. 4 is a block diagram illustrating a cross-sectional side view of the IC structure of FIG. 3.

FIG. 4 is a block diagram illustrating a cross-sectional side view of IC structure 300 of FIG. 3. More particularly, FIG. 4 illustrates a view of IC structure 300 of FIG. 3 taken along cut-line 4-4. FIG. 4 illustrates the reduced length/that is achieved by using two or more interposers as opposed to a single, larger or monolithic interposer. Referring to FIG. 4, the particular ones of solder bumps 405 that are subjected to increased levels of shear strain are illustrated with shading as opposed to the solid coloration of other ones of solder bumps 405. In this example, four interposers are used, thereby reducing/and reducing the amount of shear strain placed on solder bumps 405A-405D.

Interposer 330 can include an interconnect region 410 that can be implemented as described with reference other interconnect regions already described within this specification. One or more inter-die wires formed within interconnect region 410 can couple die 310 and die 315. Similarly, interposer 335 can include an interconnect region 415 that can be implemented as previously described. One or more inter-die wires formed within interconnect region 415 can couple die 310 to die 315. FIG. 4 also illustrates that interposer 330 and interposer 335 each can include one or more TSVs 420. TSVs 420 allow dies to couple to a substrate through an interposer to connect to nodes external to IC structure 300 and external to the IC package.

Figure 5:
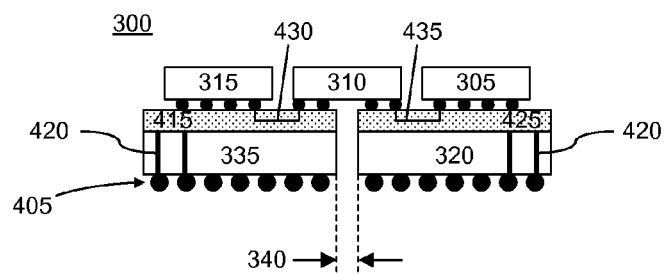
FIG. 5 is a block diagram illustrating a further cross-sectional side view of the IC structure of FIG. 3.

FIG. 5 is a block diagram illustrating a further cross-sectional side view of IC structure 300 of FIG. 3. More particularly, FIG. 5 illustrates a view of IC structure 300 of FIG. 3 taken along cut-line 5-5. As shown, interposer 335 can include one or more inter-die wires such as inter-die wire 430 coupling die 315 with die 310. Further, interposer 320 can include an interconnect region 425 that can be used to form one or more inter-die wires such as inter-die wire 435. Inter-die wire 435 can couple die 310 with die 305.

Figure 6:
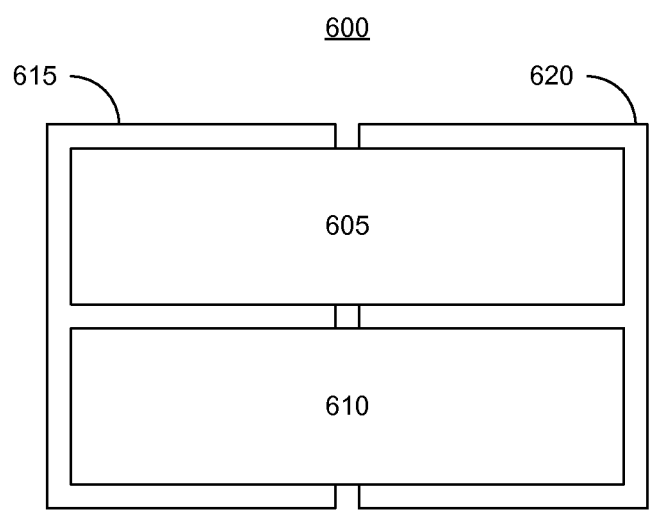
FIG. 6 is a block diagram illustrating a topographic view of an IC structure in accordance with another embodiment disclosed within this specification.

FIG. 6 is a block diagram illustrating a topographic view of an IC structure 600 in accordance with another embodiment disclosed within this specification. IC structure 600 is a multi-die IC structure. As pictured, IC structure 600 can include a plurality of dies 605 and 610. Dies 605 and 610 can be coplanar and mounted on interposers 615 and 620. Interposers 615 and 620 each can be implemented as a silicon interposer substantially as described within this specification. Interposers 615 and 620 can be coplanar and mounted on a substrate of an IC package within which IC structure 600 can be implemented. For ease of illustration, the substrate is not illustrated in FIG. 6.

A first (bottom) surface of interposer 615 can be coupled to a top surface of the substrate, e.g., using solder bumps such as C4 type solder bumps. Similarly, a first (bottom) surface of interposer 620 can be coupled to the top surface of the substrate also using solder bumps such as C4 type bumps. A second (top) surface of interposer 615 can be coupled to a portion of a bottom surface of die 605 and to a portion of a bottom surface of die 610. A second (top) surface of interposer 620 can be coupled to a portion of a bottom surface of die 605 and to a portion of a bottom surface of die 610. Dies 605 and 610 can be coupled to interposers 615 and 620 through solder bumps such as micro-bumps as previously described.

Each of interposers 615 and 620 can include one or more TSVs through which dies 605 and 610 can couple to the substrate. As such, die 605 can couple to the substrate through both interposer 615 and interposer 620. Similarly, die 610 can couple to the substrate through both interposer 615 and interposer 620. Each of interposers 615 and 620 can include an interconnect region having one or more inter-die wires that support the exchange of signals between dies 605 and 610.

Within this specification, the same reference characters are used to refer to terminals, signal lines, wires, and their corresponding signals. Accordingly, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit structure comprising:
a first interposer;
a second interposer;
wherein the first interposer and the second interposer are coplanar;
a first die coupled to the first interposer and the second interposer; and
a second die coupled to the first interposer;
wherein the first die is communicatively linked to a substrate through the first interposer and through the second interposer;

wherein the second die is communicatively linked to the substrate only through the first interposer;

wherein the first interposer and the second interposer each is passive and comprises a plurality of through-silicon vias and at least one patterned metal layer forming wires;

wherein the first die is coupled to the first and second interposer using solder bumps; and wherein the second die is coupled to the first interposer using solder bumps.

2. The integrated circuit structure of claim 1, wherein the first die and the second die are programmable integrated circuits.

3. The integrated circuit structure of claim 1, wherein the first die and the second die are field programmable gate arrays.

4. The integrated circuit structure of claim 1, further comprising:

a third die coupled to the second interposer;

wherein the third die is communicatively linked to the substrate only through the second interposer.

5. The integrated circuit structure of claim 1, wherein the first interposer and the second interposer are separated by a selected distance forming a channel; and wherein the first die spans the channel.

6. An integrated circuit structure comprising:

a substrate comprising a surface;

a first interposer comprising a first surface and a second surface;

wherein the first surface of the first interposer is coupled to the surface of the substrate;

a second interposer comprising a first surface and a second surface;

wherein the first surface of the second interposer is coupled to the surface of the substrate;

a third interposer comprising a first surface and a second surface;

wherein the first surface of the third interposer is coupled to the surface of the substrate;

a first die coupled to the second surface of the first interposer and the second surface of the second interposer;

a second die coupled to the second surface of the second interposer and the second surface of the third interposer;

a fourth interposer comprising a first surface and a second surface; and a third die coupled to the second surface of the third interposer and the second surface of the fourth interposer; and wherein the first surface of the fourth interposer is coupled to the surface of the substrate; and wherein each of the first interposer, the second interposer, the third interposer, and the fourth interposer is in a different quadrant of the surface of the substrate; and wherein the second die is further coupled to the second surface of the first interposer and the second surface of the fourth interposer.

7. The integrated circuit structure of claim 6, wherein:

the first interposer, the second interposer, and the third interposer are coplanar;

the first interposer and the second interposer are separated by a first selected distance; and the second interposer and the third interposer are separated by a second selected distance.

8. The integrated circuit structure of claim 6, wherein the first die spans a separation between the first interposer and the second interposer.

9. The integrated circuit structure of claim 8, wherein the second die spans:

the separation between the first interposer and the second interposer;

a separation between the second interposer and the third interposer; and a separation between the third interposer and the fourth interposer.

10. The integrated circuit structure of claim 6, wherein the third die spans a separation between the third interposer and the fourth interposer.

* * * * *